US008085061B2

(12) United States Patent
Kinoshita et al.

(10) Patent No.: US 8,085,061 B2
(45) Date of Patent: Dec. 27, 2011

(54) OUTPUT CIRCUIT OF SEMICONDUCTOR DEVICE

(75) Inventors: Hiroto Kinoshita, Tokyo (JP); Hiroki Fujisawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 364 days.

(21) Appl. No.: 11/892,747

(22) Filed: Aug. 27, 2007

(65) Prior Publication Data

US 2008/0054937 A1 Mar. 6, 2008

(30) Foreign Application Priority Data

Aug. 29, 2006 (JP) ................. 2006-232083

(51) Int. Cl.
*H03K 17/16* (2006.01)
(52) U.S. Cl. ....................................................... 326/30
(58) Field of Classification Search .............. 326/26, 326/30, 82–87; 327/108–109
See application file for complete search history.

(56) References Cited

U.S. PATENT DOCUMENTS

| 4,302,690 | A  | * | 11/1981 | Gollinger et al. ............... 326/60 |
| 6,326,821 | B1 |   | 12/2001 | Gabara |
| 6,445,245 | B1 | * | 9/2002  | Schultz et al. ................ 327/541 |
| 6,952,112 | B2 | * | 10/2005 | Satou et al. .................... 326/30 |
| 7,227,382 | B1 | * | 6/2007  | Talbot et al. ................... 326/87 |
| 7,295,033 | B2 |   | 11/2007 | Chung et al. |
| 7,382,152 | B2 | * | 6/2008  | Hamanaka ...................... 326/30 |
| 2005/0134303 | A1 | * | 6/2005 | Best et al. ...................... 326/30 |
| 2006/0087339 | A1 |   | 4/2006 | Chung et al. |
| 2006/0158198 | A1 |   | 7/2006 | Fujisawa |

FOREIGN PATENT DOCUMENTS

| CN | 1808902 A   | 7/2006 |
| JP | 8-32435     | 2/1996 |
| JP | 2000-31811  | 1/2000 |
| JP | 2002-152032 | 5/2002 |
| JP | 2004-032070 | 1/2004 |
| JP | 2005-159702 | 6/2005 |
| JP | 2006-115489 | 4/2006 |
| JP | 2006-203405 | 8/2006 |

OTHER PUBLICATIONS

Japanese Office Action dated Jul. 1, 2008 with Partial English-Language Translation.
Chinese Office Action dated Sep. 14, 2010 with an English translation.

* cited by examiner

*Primary Examiner* — Shawki S Ismail
*Assistant Examiner* — Thienvu Tran
(74) *Attorney, Agent, or Firm* — McGinn IP Law Group, PLLC

(57) ABSTRACT

An output circuit of a semiconductor includes unit buffers, each unit buffer having transistors and resistors connected between a power source terminal VDDQ and an output terminal DQ, and transistors and resistors connected between a power source terminal VSSQ and an output terminal DQ. On-resistance values of transistors included in the unit buffers are mutually substantially the same, and resistance values of resistors included in the unit buffers are mutually different. A deviation of impedances attributable to a power source resistance can be offset based on a difference between resistance values of the resistors.

10 Claims, 17 Drawing Sheets

| TARGET OUTPUT IMPEDANCE | OUTPUT BUFFER 510 | OUTPUT BUFFER 520 | OUTPUT BUFFER 530 | OUTPUT BUFFER 540 | ACTUAL OUTPUT IMPEDANCE | CONVENTIONAL OUTPUT IMPEDANCE |
|---|---|---|---|---|---|---|
| 240Ω | O | | | | 240Ω | 240Ω |
| 120Ω | | O | | | 120.7Ω | 120.7Ω |
| 80Ω | O | O | | | 80.9Ω | 80.9Ω |
| 60Ω | O | | O | | 59.2Ω | 61.1Ω |
| 48Ω | O | O | O | | 47.9Ω | 49.1Ω |
| 40Ω | O | O | O | | 40.3Ω | 41.2Ω |
| 34Ω | O | O | O | O | 34.4Ω | 35.5Ω |

O···ACTIVATED

OUTPUT CIRCUIT OF SEMICONDUCTOR DEVICE

TECHNICAL FIELD

The present invention relates to an output circuit of a semiconductor device. Particularly, the invention relates to an output circuit capable of changing over an output impedance. The present invention also relates to a data processing system that includes a semiconductor memory device having an output circuit.

BACKGROUND OF THE INVENTION

In recent years, significantly high data transfer rate is required for data transfer between semiconductor devices (between CPUs and memories for example). To accomplish high data transfer rate, the amplitude of input/output signals is increasingly reduced. If the input/output signals have reduced amplitudes, the desired accuracy of impedances of output buffers becomes severe.

The impedance of the output buffer varies depending on process conditions during the manufacturing. Also, during its actual use, the impedance of the output buffer is affected by variations in ambient temperature and power source voltage. When high impedance accuracy is required for the output buffer, output buffers that can adjust their impedances are utilized (Japanese Patent Application Laid-open Nos. 2002-152032, 2004-32070, 2006-203405, and 2005-159702). The impedance of such an output buffer is adjusted by circuits generally called "calibration circuits".

As disclosed in Japanese Patent Application Laid-open Nos. 2006-203405, and 2005-159702, the calibration circuit includes a replica buffer with the same configuration as the output buffer. When a calibration operation is performed, with an external resistor connected to a calibration terminal, the voltage of the calibration terminal is compared to the reference voltage and the impedance of the replica buffer is adjusted accordingly. The result of adjustment of the replica buffer is then reflected in the output buffer, and the impedance of the output buffer is thus set to the desired value.

On the other hand, in a semiconductor device such as a DRAM (Dynamic Random Access Memory), the impedance of the output circuit is required to be changeable. To meet this requirement, it is considered suitable to provide plural output buffers having different impedances. However, according to this method, the circuit scale of the total output circuit becomes very large, and the calibration circuit needs to be provided in each output buffer.

In order to solve the above problems, not plural output buffers having different impedances are prepared, but plural unit buffers each having mutually the same configuration are prepared, and the number of unit buffers used in parallel may be changed according to specified impedances. According to this method, when the impedance of one unit buffer is X, the output impedance can be set to X/Y by using Y output buffers in parallel.

SUMMARY OF THE INVENTION

However, as a result of researches the present inventors have carried out about the method of using unit buffers in parallel, it has become clear that the error of the output impedance becomes large along the increase in the number of unit buffers used in parallel.

Therefore, it is an object of the present invention to increase the impedance precision of an output circuit of which output impedance can be changeable by using the unit buffers in parallel.

The present inventors have carried out researches of causes of the increase in errors in the output impedances along the increase in the number of unit buffers used in parallel. As a result, the present inventors have found that a power source resistance present between the power source terminal and the output circuit is a main cause of the increase in errors. The present invention has been achieved based on this technical knowledge.

The above and other objects of the present invention can be accomplished by an output circuit of a semiconductor device comprising a plurality of unit buffers connected in parallel, each unit buffer having transistor and resistor connected in series between a power source terminal and an output terminal, wherein ON resistance values of the transistors included in the plurality of unit buffers are mutually substantially the same, and out of the plurality of unit buffers, resistance values of the resistors included in at least two unit buffers are different from each other.

The above and other objects of the present invention can also be accomplished by an output circuit of a semiconductor device comprising:

a first output buffer including one unit buffer having a series circuit of transistor and resistor;

a second output buffer having m unit buffers connected in parallel, each unit buffer having a series circuit of transistor and resistor; and a third output buffer having n unit buffers connected in parallel, each unit buffer having a series circuit of transistor and resistor, wherein ON resistance values of the transistors included in the first to the third output buffers are mutually substantially the same, resistance values of the resistors included in the second output buffer are mutually substantially the same, resistance values of the resistors included in the third output buffer are mutually substantially the same, and resistance values of at least the two resistors included in the first to the third output buffers are different from each other.

The resistance values of the resistor included in the first output buffer can be different from the resistance values of the resistors included in the third output buffer. The resistance values of the resistors included in the second output buffer can be different from the resistance values of the resistors included in the third output buffer. It is preferable that the resistance values of the resistors included in the third output buffer are lower than at least one of the resistance values of the resistors included in the first and the second output buffers.

In the case where m is equal to 2 and n is equal to 3, when one unit buffer is used, the first output buffer can be selected, when two unit buffers are used, the second output buffer can be selected, when three unit buffers are used, the first and the second output buffers can be selected simultaneously, when four unit buffers are used, the first and the third output buffers can be selected simultaneously, when five unit buffers are used, the second and the third output buffers can be selected simultaneously, and when six unit buffers are used, the first to the third output buffers can be selected simultaneously.

As explained above, according to the present invention, because the resistance values of resistors included in the unit buffers are differentiated, the deviation of impedances attributable to the power source resistance can be offset. Therefore, even when the number of unit buffers used in parallel is large, the impedance of the output circuit can be set to approximately a desired value.

Further, by carrying out the accurate calibration operation, the data transfer speed on the system can be increased, and a higher-speed data processing system can be configured.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 14 is a table showing a relationship between a target output impedance and an output buffer to be operated;

DETAILED DESCRIPTION OF THE EMBODIMENTS

Preferred embodiments of the present invention will now be explained in detail with reference to the drawings.

Figure 1:
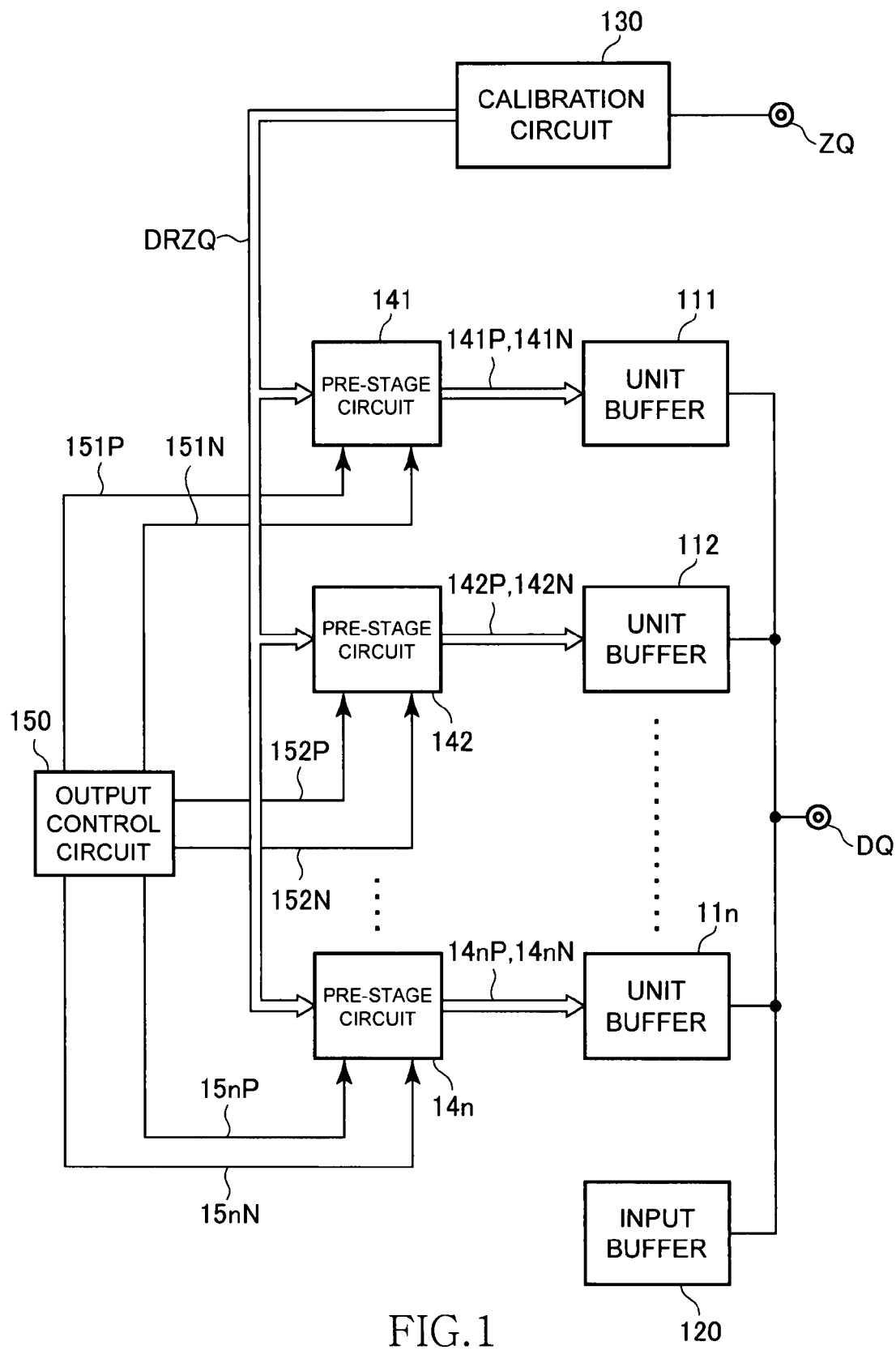
FIG. 1 is a block diagram showing a configuration of an output circuit (an input and output circuit) of a semiconductor device according to a first preferred embodiment of the present invention.

FIG. 1 is a block diagram showing a configuration of an output circuit (an input and output circuit) 100 of a semiconductor device according to a first preferred embodiment of the present invention.

As shown in FIG. 1, the output circuit 100 according to the present embodiment includes n unit buffers 111 to 11n and an input buffer 120 that are connected to an output terminal DQ, and a calibration circuit 130 connected to a calibration terminal ZQ. The input buffer 120 is activated at the data input time. Because details of a circuit configuration and a data input operation of the input buffer 120 are not directly related to the content of the present invention, their explanations will be omitted in the present specification.

Figure 2:
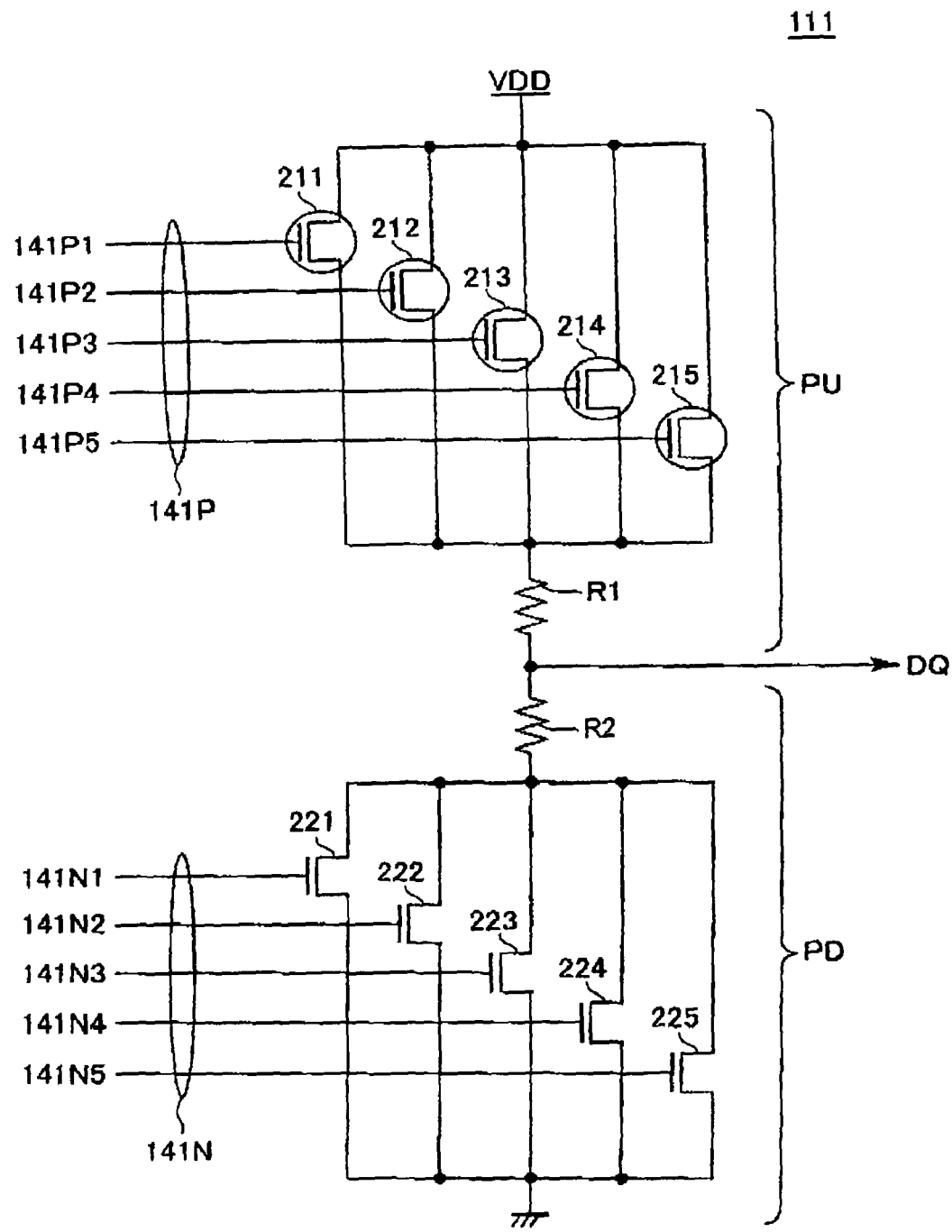
FIG. 2 is a circuit diagram of a unit buffer shown in FIG. 1.

FIG. 2 is a circuit diagram of the unit buffer 111.

As shown in FIG. 2, the unit buffer 111 includes plural (five in this embodiment) P-channel MOS transistors 211 to 215 connected in parallel, plural (five in this embodiment) N-channel MOS transistors 221 to 225 connected in parallel, and resistors R1 and R2 that are connected in series between the transistors 211 to 215 and the transistors 221 to 225. A contact point between the resistor R1 and the resistor R2 is connected to the data terminal DQ. Of the unit buffer 111, a part including the P-channel MOS transistors 211 to 215 and the resistor R1 constitutes a pull-up circuit PU. A part including the N-channel MOS transistors 221 to 225 and the resistor R2 constitutes a pull-down circuit PD.

Five operation signals 141P1 to 141P5 that constitute the operation signal 141P are supplied to the gates of the transistors 211 to 215. Five operation signals 141N1 to 141N5 that constitute the operation signal 141N are supplied to the gates of the transistors 221 to 225. Based on this arrangement, the ten transistors that are included in the unit buffer 111 can be individually on/off controlled based on the ten operation signals including the operation signals 141P1 to 141P5 and the operation signals 141N1 to 141N5.

The parallel circuit including the transistors 211 to 215, and the parallel circuit including the transistors 221 to 225 are designed to have resistance $r_{mos}$ during the conduction time.

However, the ON resistance of the transistors varies depending on manufacturing conditions, and also varies depending on the ambient temperature and the power supply voltage during the operation. Therefore, desired impedance is not always obtained. In order to set $r_{mos}$ to the impedance, the number of transistors to be turned on needs to be adjusted. For this purpose, the parallel circuits including plural transistors are used.

In order to adjust the impedance finely and in a wide range, it is preferable to mutually differentiate a W/L ratio (a gate width to gate length ratio) of the plural transistors that constitute the parallel circuit. Preferably, weight of the power of two is used. Considering this point, according to this embodiment, when the W/L ratio of the transistor 211 is "1", the W/L ratios of the transistors 212 to 215 are set to "2", "4", "8", and "16", respectively (The values of the W/L ratios are relative values, and do not represent actual W/L ratios. This similarly applies to the following explanations). By suitably selecting the transistors to be turned on based on the operation signals 141P1 to 141P5 and the operation signals 141N1 to 141N5, the on resistance of the parallel circuit can be fixed to substantially $r_{mos}$, regardless of the variation due to the manufacturing conditions and a temperature change. The resistance $r_{mos}$ is set to 120Ω for example.

A resistance value of the resistor R1 is set to a value approximately the same as the on resistance $r_{mos}$ of the parallel circuit, for example, 120Ω. Accordingly, when at least one of the pull-up circuit PU and the pull-down circuit PD becomes in the on state, the impedance of the unit buffer 111 observed from the output terminal DQ becomes 240Ω. Tungsten (W), for example, can be used for the resistor R1.

Each of the other unit buffers 112 to 11n also has approximately the same circuit configuration as that of the unit buffer 111 shown in FIG. 2. Regarding the operation signals, corresponding operation signals 142P, 142N to 14nP, and 14nN are used, in place of the operation signals 141P and 141N. Resistors R2 to Rn are used in place of the resistor R1.

Figure 3:
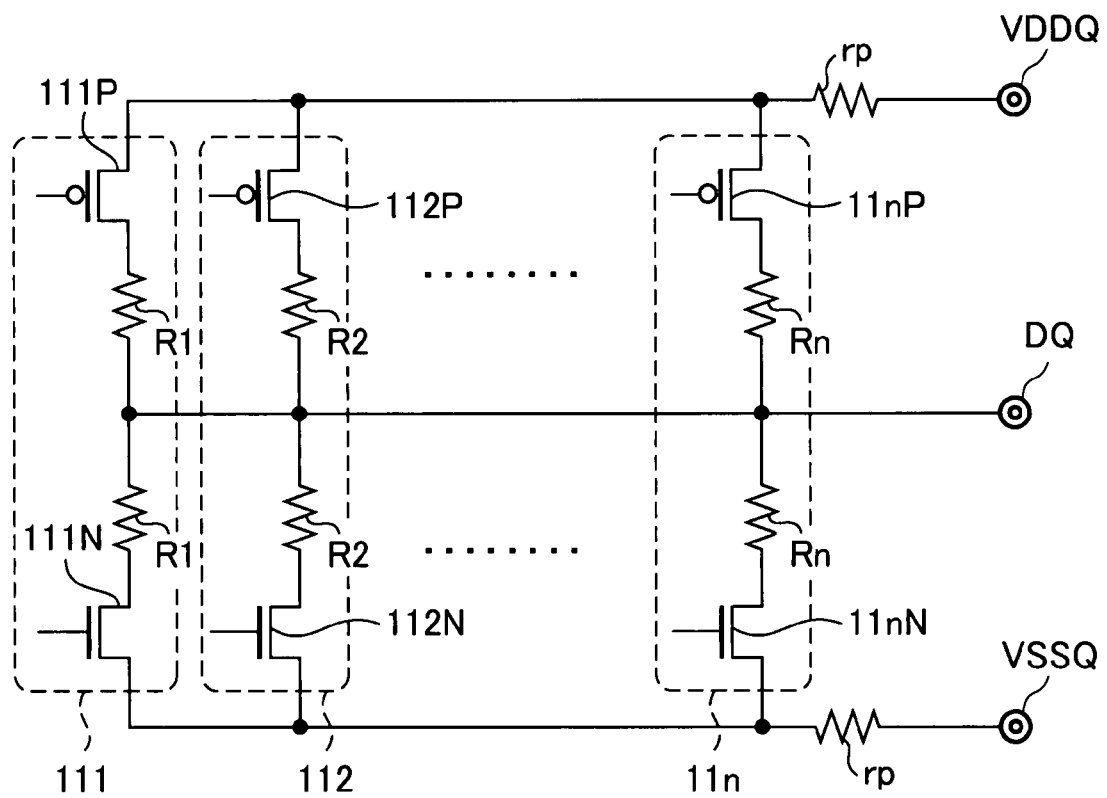
FIG. 3 is an equivalent circuit diagram of the unit buffers shown in FIG. 1.

FIG. 3 is an equivalent circuit diagram of the unit buffers 111 to 11n.

In FIG. 3, parallel transistors included in the unit buffers 111 to 11n are expressed equivalently as one transistor. For example, a transistor 111P shown in FIG. 3 corresponds to the transistors 211 to 215 included in the unit buffer 111, and a transistor 111N shown in FIG. 3 corresponds to the transistors 221 to 225 included in the unit buffer 111. Similarly, transistors 112P and 112N correspond to two parallel circuits included in the unit buffer 112, and transistors 11nP and 11nN correspond to two parallel circuits included in the unit buffer 11n.

As shown in FIG. 3, the unit buffers 111 to 11n are connected between a power source terminal VDDQ and a power source terminal (a ground terminal) VSSQ, respectively. However, on the chip, there is some distance between the power source terminal VDDQ and the unit buffers 111 to 11n, and between the power source terminal VSSQ and the unit buffers 111 to 11n. Therefore, a predetermined resistance component $r_p$ (a power source resistance) is present between the above power source terminal and the unit buffers, respectively. Some resistance component is also present between the unit buffers. However, the unit buffers 111 to 11n are collectively disposed at one position on the chip, that is, near the output terminal DQ. Therefore, the resistance component between the unit buffers can be substantially disregarded.

In the present embodiment, resistance values of the resistors R1 to Rn included in the unit buffers 111 to 11n, respectively are set to R1>R2>, . . . >Rn. As described above, the resistance value of the resistor R1 is set to substantially the same value as the on resistance $r_{mos}$ of the parallel circuit. Therefore, the resistance values of other resistors R2 to Rn are set slightly lower than the resistance value of the resistor R1.

Specifically, a value of Rj−R(j+1) (where j denotes integers of 1 to n−1) is preferably larger than the resistance of a power source resistance $r_p$, and is preferably about two times of the resistance of the power source resistance $r_p$. In other words, preferably, the following relationship is set: R1≈R2+2$r_p$≈R3+4$r_p$≈ . . . ≈Rn+2$r_p$(n−1). While the effect of this relationship is explained in detail later, it becomes possible to offset the deviation of impedances that occurs when the unit buffers 111 to 11n are operated in parallel.

Figure 4:
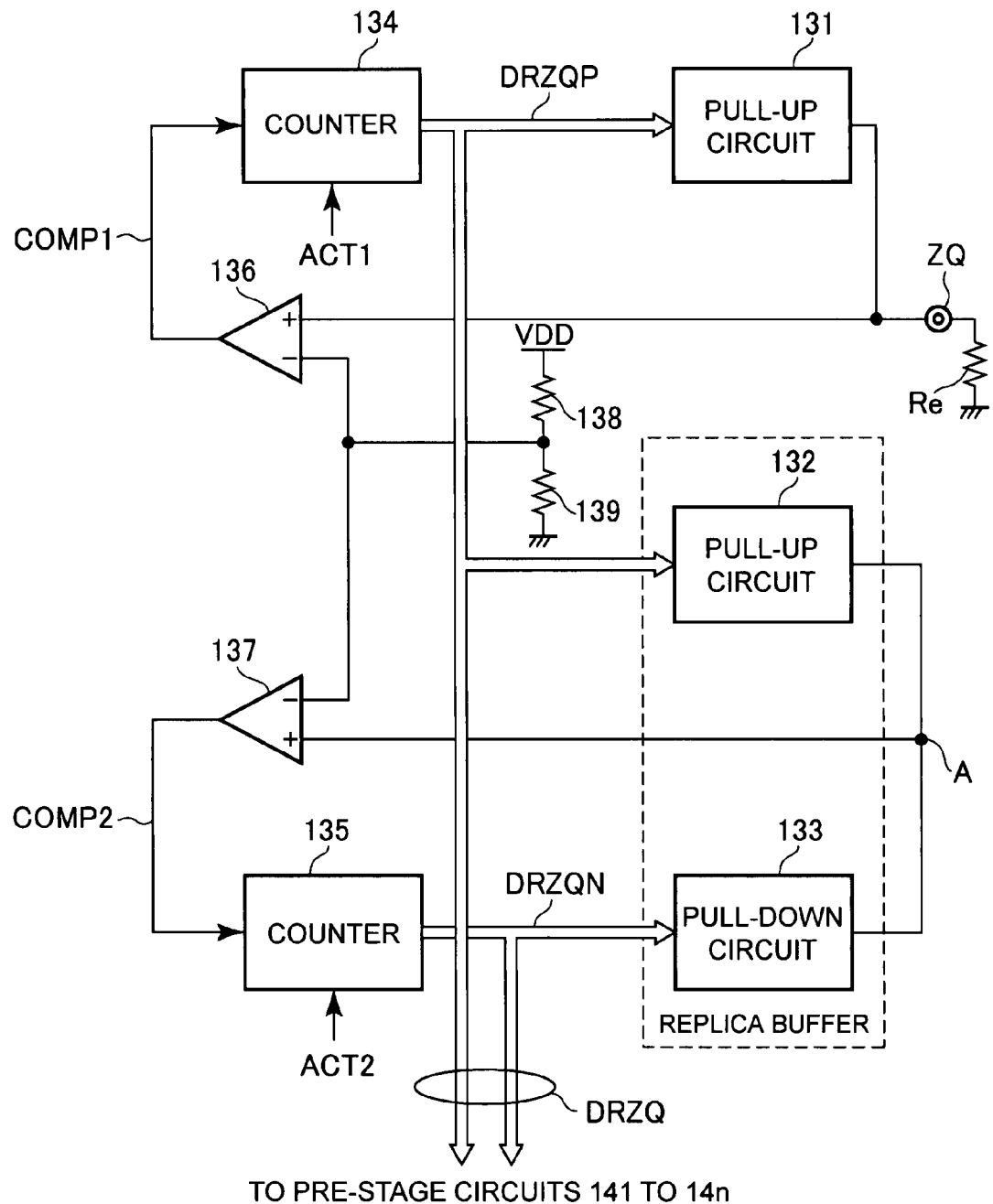
FIG. 4 is a circuit diagram of a calibration circuit shown in FIG. 1.

FIG. 4 is a circuit diagram of the calibration circuit 130.

As shown in FIG. 3, the calibration circuit 130 includes pull-up circuits 131 and 132, a pull-down circuit 133, a counter 134 that controls the operation of the pull-up circuits 131 and 132, a counter 135 that controls the operation of the pull-down circuit 133, a comparator 136 that controls the counter 134, and a comparator 137 that controls the counter 135.

Figure 5:
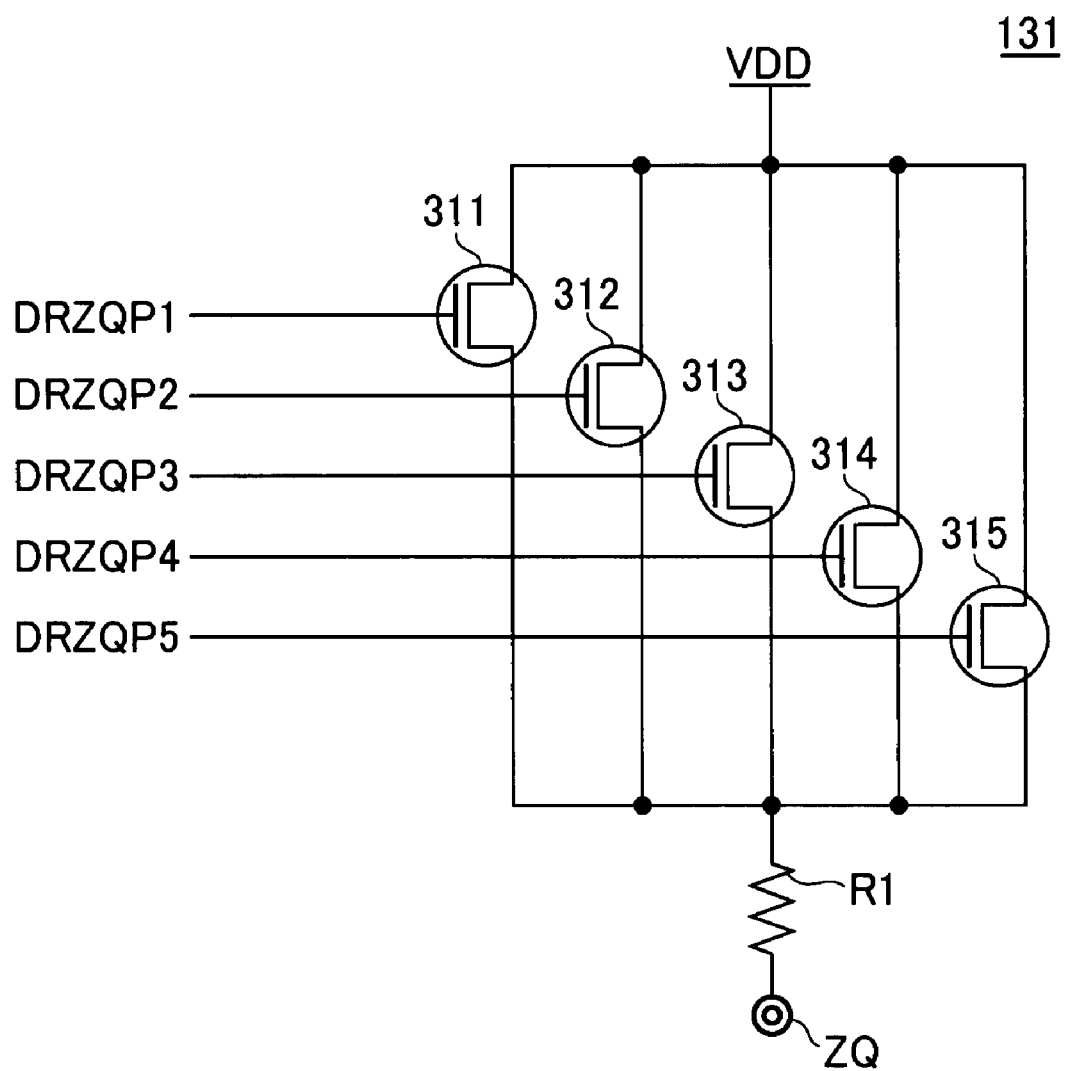
FIG. 5 is a circuit diagram of a pull-up circuit shown in FIG. 4.

FIG. 5 is a circuit diagram of the pull-up circuit 131.

As shown in FIG. 5, the pull-up circuit 131 has a circuit structure substantially the same as that of the pull-up circuit PU included in the unit buffer 111. Specifically, the pull-up circuit 131 includes five P-channel MOS transistors 311 to 315 that are connected in parallel, and a resistor R1 of which one end is connected to drains of these transistors. The other end of the resistor R1 is connected to a calibration terminal ZQ.

The transistors 311 to 315 included in the pull-up circuit 131 correspond to the transistors 211 to 215 shown in FIG. 2, and have the same impedance, respectively. Therefore, like the W/L ratios of the transistors 211 to 215, the W/L ratios of the transistors 311 to 315 are also set to "1", "2", "4", "8", and "16", respectively. However, so long as the impedances are substantially the same, the transistor sizes of the transistors 311 to 315 included in the pull-up circuit 131 do not need to be exactly the same as the transistor sizes of the transistors 211 to 215 shown in FIG. 2, and shrunk transistors can be also used.

The resistor R1 also corresponds to the resistor R1 shown in FIG. 2. Therefore, resistance of the resistor R1 included in the pull-up circuit 131 is also set to $r_{mos}$, 120Ω for example.

The counter 134 supplies impedance control signals DRZQP1 to DRZQP5 to the gates of the transistors 311 to 315, respectively, thereby controlling the operation of the pull-up circuit 131. The impedance control signals DRZQP1 to DRZQP5 correspond to the operation signals 141P1 to 141P5.

The pull-up circuit 132 also has the same circuit structure as that of the pull-up circuit 131 shown in FIG. 5. The impedance control signals DRZQP1 to DRZQP5 are also supplied to the gates of the five transistors included in the pull-up circuit 132.

Figure 6:
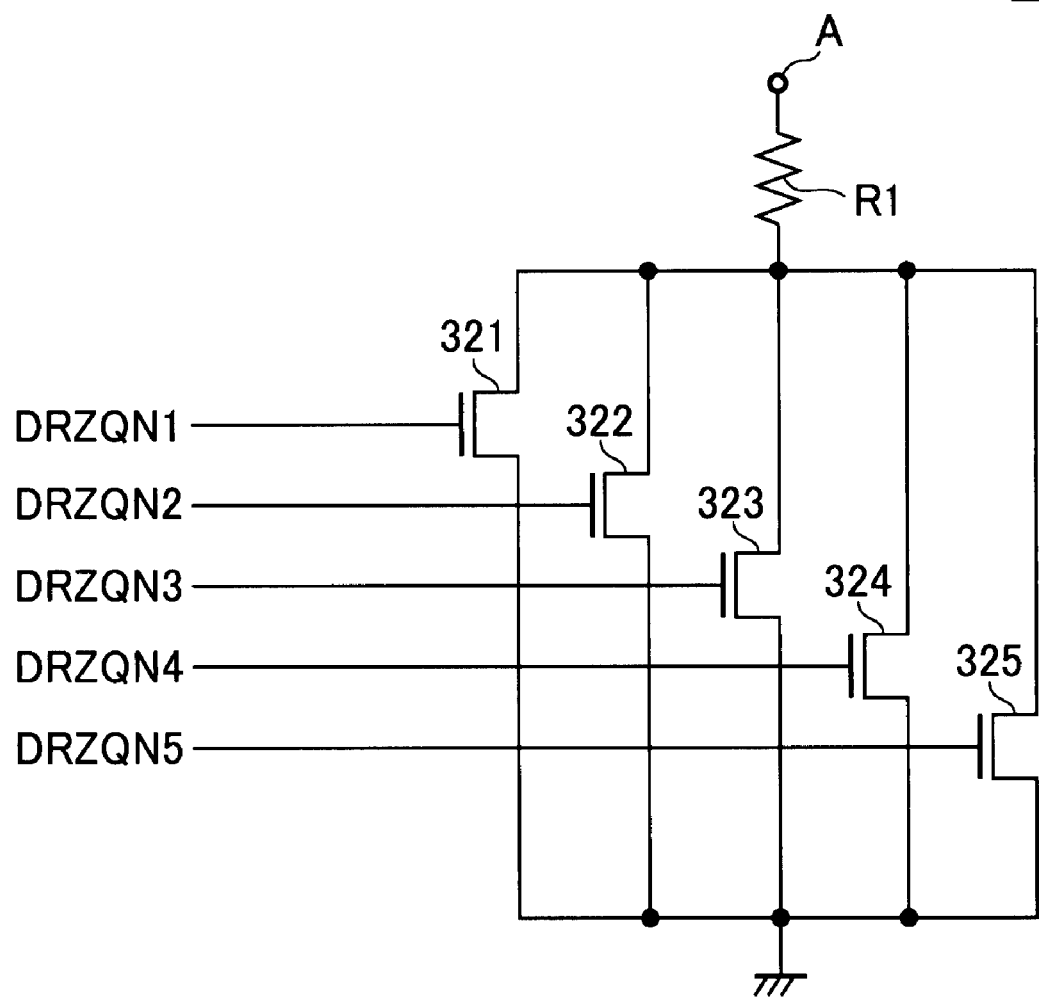
FIG. 6 is a circuit diagram of a pull-down circuit shown in FIG. 4.

FIG. 6 is a circuit diagram of the pull-down circuit 133.

As shown in FIG. 6, the pull-down circuit 133 has a circuit structure substantially the same as that of the pull-down circuit PD included in the unit buffer 111. Specifically, the pull-down circuit 133 includes five N-channel MOS transistors 321 to 325 that are connected in parallel, and a resistor R1 of which one end is connected to drains of these transistors.

The transistors 321 to 325 included in the pull-down circuit 133 correspond to the transistors 221 to 225 shown in FIG. 2, and have the same impedance, respectively. The configuration of the pull-down circuit 133 is similar to that of the pull-up circuit 131, in this respect. The resistor R1 also corresponds to the resistor R1 shown in FIG. 2. Therefore, resistance of the resistor R1 included in the pull-down circuit 133 is also set to $r_{mos}$, 120Ω for example.

The counter 135 supplies impedance control signals DRZQN1 to DRZQN5 to the gates of the transistors 321 to 325, respectively, thereby controlling the operation of the pull-down circuit 133. The impedance control signals DRZQN1 to DRZQN5 correspond to the operation signals 141N1 to 141N5.

As explained above, the pull-up circuits 131 and 132 have substantially the same circuit structures as that of the pull-up circuit PU included in the unit buffer 111. The pull-down circuit 133 has substantially the same circuit structure as that of the pull-down circuit PD included in the unit buffer 111. Therefore, impedance of the pull-up circuits 131 and 132 and the pull-down circuit 133 is set to 240Ω for example.

Figure 7:
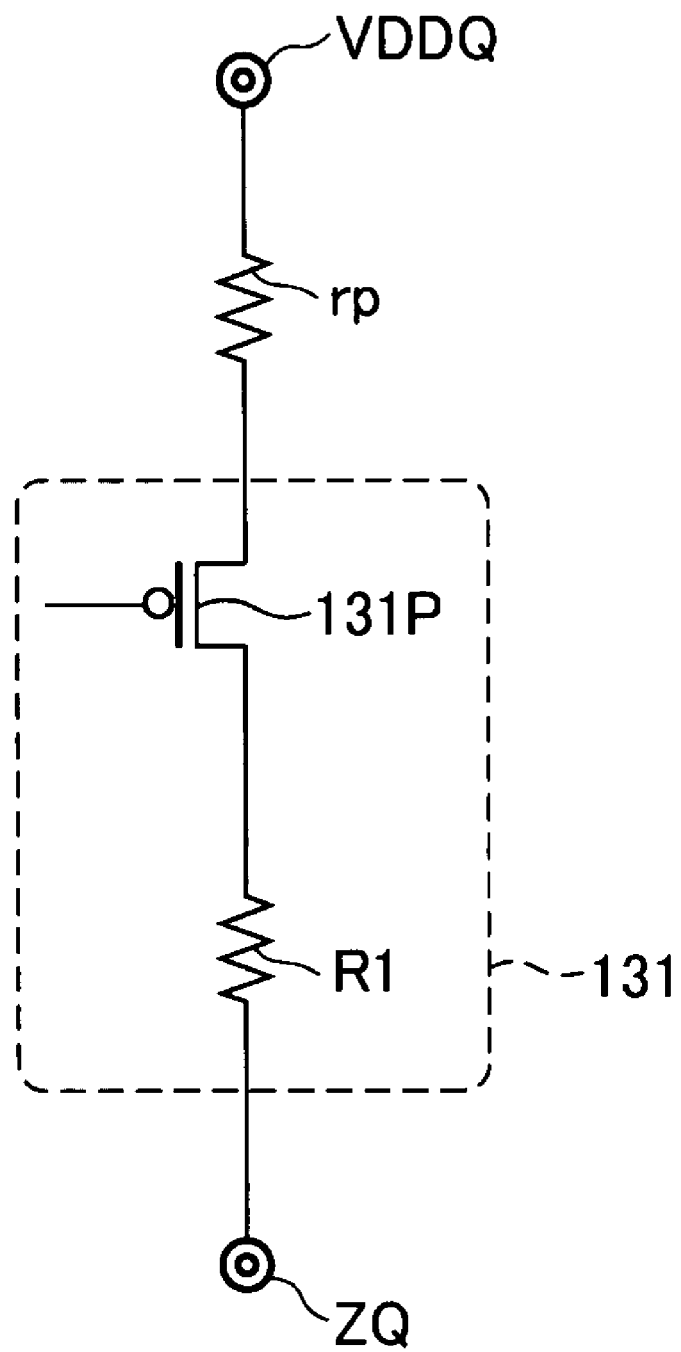
FIG. 7 is an equivalent circuit diagram of the pull-up circuit shown in FIG. 5.

However, because the pull-up circuit 131 is connected between the power source terminal VDDQ and the calibration terminal ZQ, the power source resistance $r_p$ is present between the power source terminal VDDQ and the calibration terminal ZQ as shown in FIG. 7. Therefore, in the calibration operation using the pull-up circuit 131, the impedance of a transistor 131P is adjusted in the state that the power source resistance $r_p$ is included. The transistor 131P equivalently shows the parallel circuit of transistors 311 to 315 shown in FIG. 5.

Because the calibration circuit 130 is provided near the unit buffers 111 to 11n, the value of the power source resistance $r_p$ added to the pull-up circuit 131 approximately coincides with the resistance of the power source resistance $r_p$ added to the unit buffers 111 to 11n.

As shown in FIG. 4, the pull-up circuit 132 and the pull-down circuit 133 constitute a "replica buffer" that has substantially the same circuit configuration of the unit buffer 111. That the replica buffer has "substantially the same" circuit structure means that the transistors included in the replica buffers are regarded the same when they are shrunk. A contact A as the output end of the replica buffer is connected to a non-inverted input terminal (+) of the comparator 137, as shown in FIG. 4.

The counter 134 counts up or counts down when a control signal ACT1 is activated. When a comparison signal COMP1 that is output from the comparator 136 is at a high level, the counter 134 continues counting up, and when the signal COMP1 is at a low level, the counter 134 continues counting down. A non-inverted input terminal (+) of the comparator 136 is connected to the calibration terminal ZQ, and an inverted input terminal (−) is connected to an intermediate point between the resistors 138 and 139 that is connected to a power supply potential (VDD) and a ground potential (GND).

Based on this structure, the comparator 136 compares the potential of the calibration terminal ZQ with the intermediate voltage (VDD/2). When the former potential is higher, the output comparison signal COMP1 is set to a high level. When the latter potential is higher, the comparison signal COMP1 is set to a low level.

On the other hand, the counter 135 counts up or counts down when a control signal ACT2 is activated. When a comparison signal COMP2 that is output from the comparator 137 is at a high level, the counter 135 continues counting up, and when the signal COMP2 is at a low level, the counter 135 continues counting down. A non-inverted input terminal (+) of the comparator 137 is connected to a contact point A as the output end of the replica buffer, and an inverted input terminal (−) is connected to an intermediate point between the resistors 138 and 139.

Based on this structure, the comparator 137 compares the output potential of the replica buffer with the intermediate voltage (VDD/2). When the former potential is higher, the output comparison signal COMP2 is set to a high level. When the latter potential is higher, the comparison signal COMP2 is set to a low level.

When the control signals ACT1 and ACT2 are inactivated, the counters 134 and 135 stop the count operation, and hold the current count value. As described above, the count value of the counter 134 is used for the impedance control signal DRZQP, and the count value of the counter 135 is used for the impedance control signal DRZQN. The collective impedance control signal DRZQ is supplied in common to the pre-stage circuits 141 to 14n shown in FIG. 1.

Figure 8:
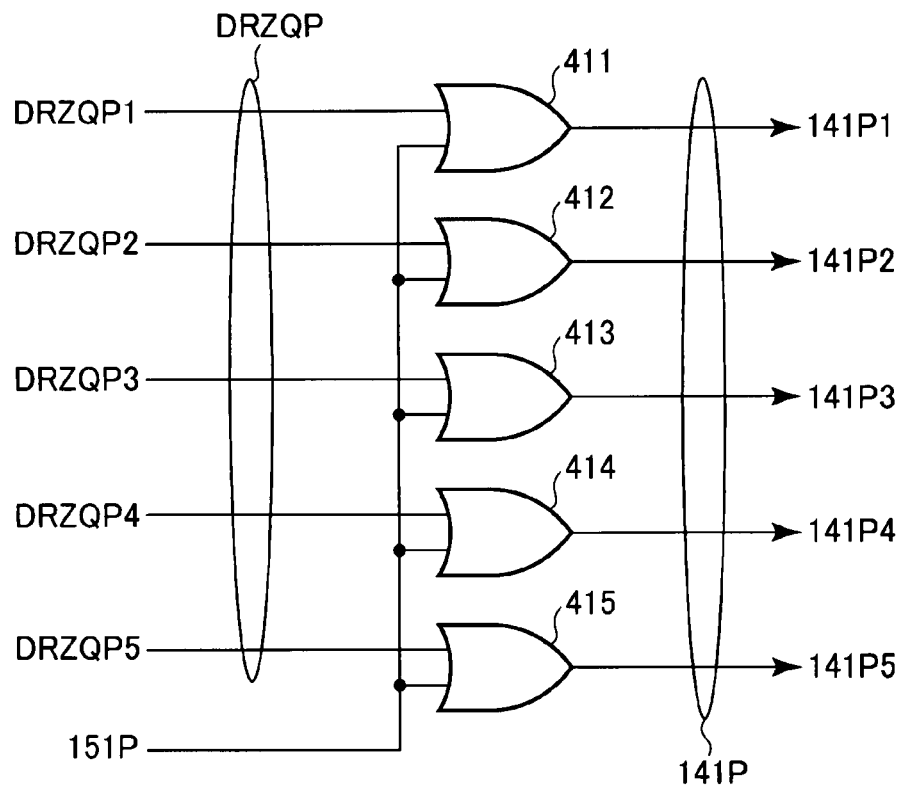
FIG. 8 is a circuit diagram of the pre-stage circuit shown in FIG. 1.
Figure 8:
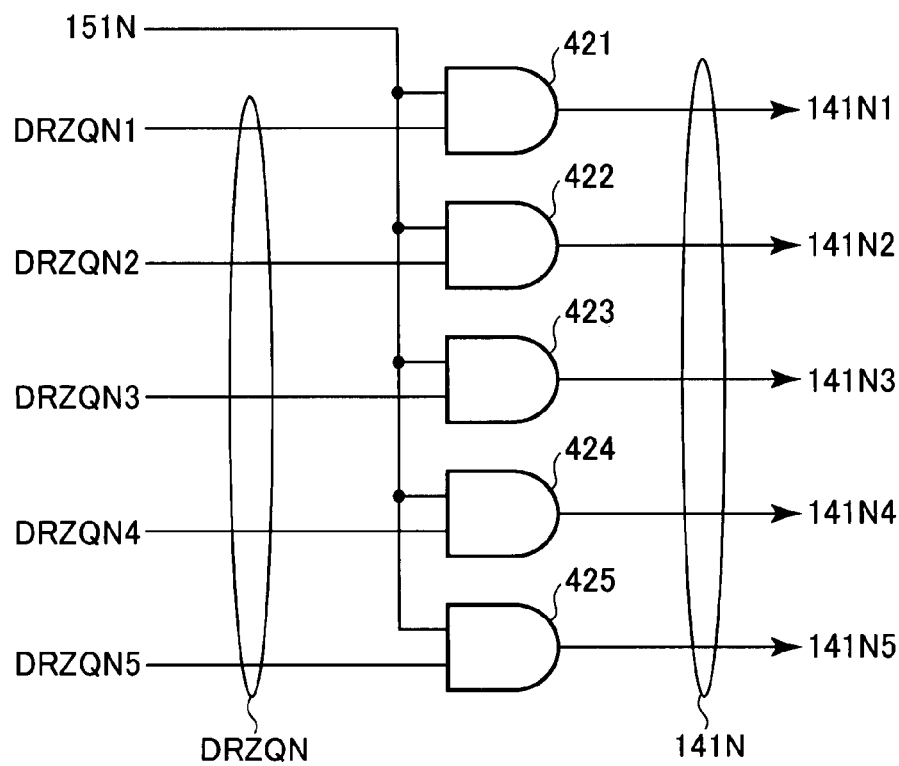

FIG. 8 is a circuit diagram of the pre-stage circuit 141.

As shown in FIG. 8, the pre-stage circuit 141 includes five OR circuits 411 to 415 and five AND circuits 421 to 425. An output control circuit 150 shown in FIG. 1 supplies a selection signal 151P in common to the OR circuits 411 to 415, and the calibration circuit 130 supplies the impedance control signals DRZQP1 to DRZQP5 to the OR circuits 411 to 415, respectively. On the other hand, the output control circuit 150 supplies the selection signal 151N in common to the AND circuits 421 to 425, and the calibration circuit 130 supplies the impedance control signals DRZQN1 to DRZQN5 to the AND circuits 421 to 425, respectively.

The operation signals 141P1 to 141P5 that constitute the operation signal 141P output from the OR circuits 411 to 415, and the operation signals 141N1 to 141N5 that constitute the operation signal 141N output from the AND circuits 421 to 425, are supplied to the unit buffer 111, as shown in FIGS. 1 and 2, thereby controlling the corresponding transistors.

The other pre-stage circuits 142 to 14n also have circuit configurations similar to those of the pre-stage circuit 141 shown in FIG. 8. In this case, the selection signals 152P and 152N to 15nP and 15nN from the output control circuit 150 are supplied to the OR circuits and the AND circuits that are included in the corresponding pre-stage circuits 142 to 14n.

The configuration of the output circuit 100 according to this embodiment has been explained above. The operation of the output circuit 100 according to this embodiment is explained next, in the order of the calibration operation and the data output operation.

First, the calibration operation will be now explained.

The calibration operation is for adjusting the impedance of the unit buffers 111 to 11n. The calibration operation is carried out to correct variations of the impedance due to process conditions at the manufacturing time, and to correct changes of the impedance due to changes in the ambient temperature and variations in the power supply voltage.

Therefore, when high precision is required, it is preferable to periodically execute the calibration operation during the actual operation, instead of carrying out the calibration operation only once at the power supply time or the initialization time such as the resetting time. The calibration operation is explained in detail below.

In executing the calibration operation, first, the external resistor Re needs to be connected to the calibration terminal ZQ (see FIG. 4). The external resistor Re needs to have impedance that is the same as the impedance (i.e., the impedance of a replica buffer) required for the unit buffers 111 to 11n. Therefore, if target impedance of the unit buffers 111 to 11n is 240Ω, the external resistor Re having 240Ω is used.

Figure 9:
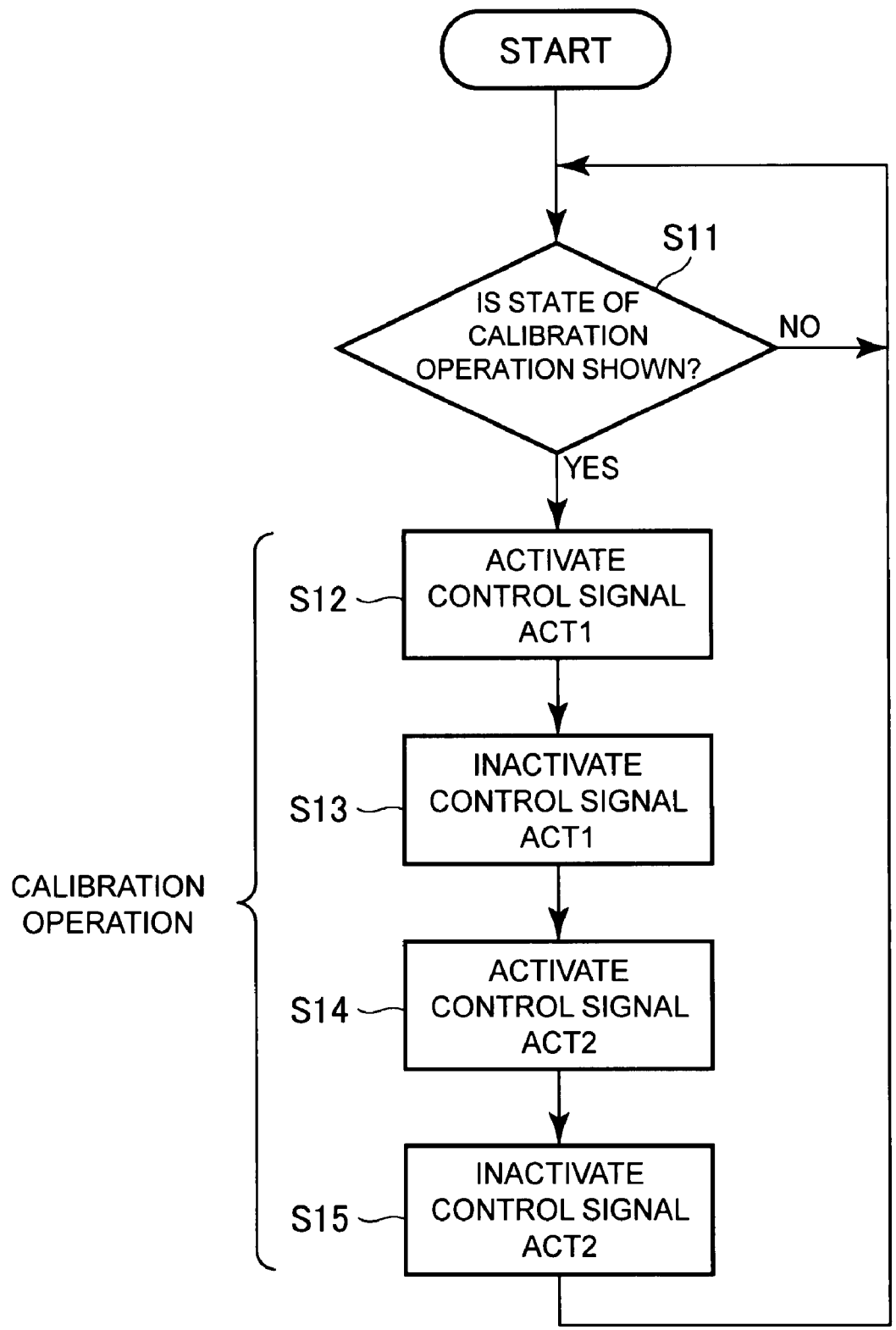
FIG. 9 is a flowchart for explaining the calibration operation.

FIG. 9 is a flowchart for explaining the calibration operation.

First, when the calibration operation is instructed by an external command (step S11: YES), the control signal ACT1 is activated, and the counter 134 included in the calibration circuit 130 starts a count operation (step S12).

Therefore, if the comparison signal COMP1 outputted from comparator 136 is in a low level, the counter 134 continues counting down in synchronized with the control signal ACT1. The on/off state of the transistors 311 to 315 shown in FIG. 5 is switched over linked to the count down. Specifically, because the W/L ratios of the transistors 311 to 315 are set to "1", "2", "4", "8", and "16", respectively, the least significant bit (LSB) of the counter 134 is allocated to the impedance control signal DRZQP1, and the most significant bit (MSB) of the counter 134 is allocated to the impedance control signal DRZQP5. With this arrangement, the impedance of the pull-up circuit 131 can be changed at a minimum pitch.

Figure 10:
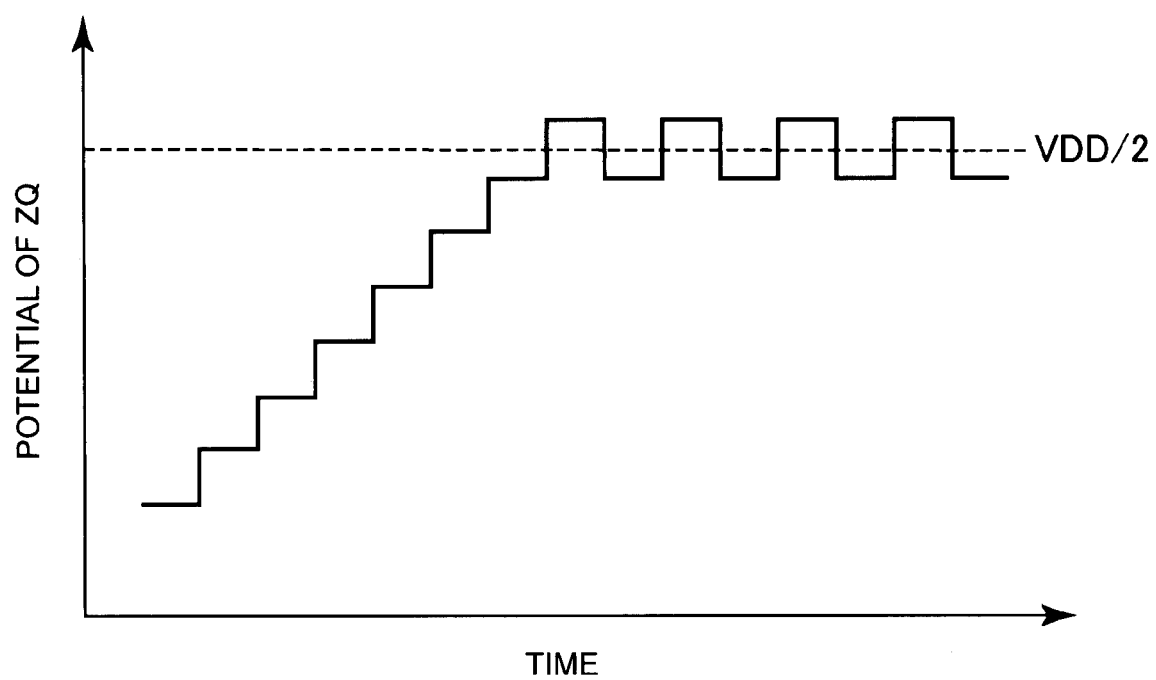
FIG. 10 is a graph showing an example of a change of potential at the calibration terminal during the calibration operation.

When the count down continues, the impedance of the pull-up circuit 131 gradually decreases, and the potential of the calibration terminal ZQ gradually increases as shown in FIG. 10. When the impedance of the pull-up circuit 131 decreases to less than the target impedance Re, 240Ω for example, the potential of the calibration terminal ZQ exceeds the intermediate voltage (VDD/2). Therefore, the comparison signal COMP1 that is output from the comparator 136 is inverted to a high level. In response to this, the counter 134 continues counting up, thereby increasing the impedance of the pull-up circuit 131 this time.

Figure 11:
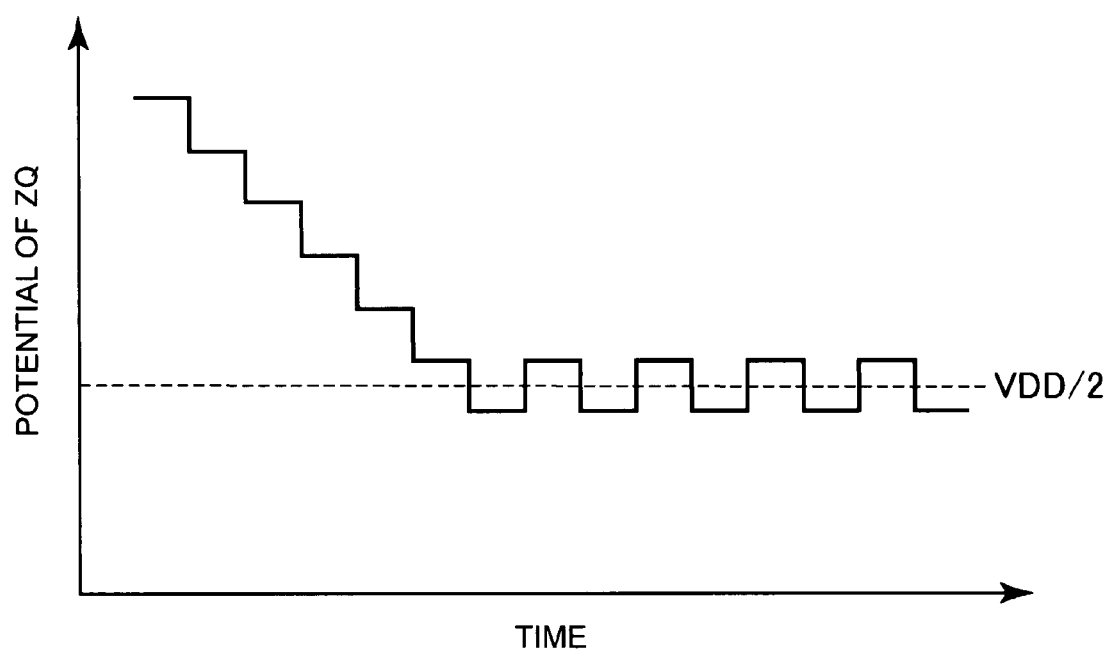
FIG. 11 is a graph showing another example of a change of potential at the calibration terminal during the calibration operation.

On the other hand, if the comparison signal COMP1 outputted from comparator 136 is in a high level, the counter 134 continues counting up in synchronized with the control signal ACT1. The on/off state of the transistors 311 to 315 shown in FIG. 5 is switched over linked to the count up. When the count up continues, the impedance of the pull-up circuit 131 gradually increases, and the potential of the calibration terminal ZQ gradually decreases as shown in FIG. 11. When the impedance of the pull-up circuit 131 increases to more than the target impedance Re, 240Ω for example, the potential of the calibration terminal ZQ exceeds the intermediate voltage (VDD/2). Therefore, the comparison signal COMP1 that is output from the comparator 136 is inverted to a low level. In response to this, the counter 134 continues counting down, thereby decreasing the impedance of the pull-up circuit 131 this time.

By repeating this operation, the potential of the calibration terminal ZQ is stabilized near the intermediate voltage (VDD/2). Thereafter, the control signal ACT1 is inactivated, thereby stopping the count operation of the counter 134 (step S13). As a result, the count value of the counter 134 is fixed, and the levels of the impedance control signals DRZQP1 to DRZQP5 that constitute the impedance control signals DRZQP are firmed. Because the impedance control signals DRZQP is also supplied to the pull-up circuit 132, the pull-up circuits 131 and 132 have the same impedance as each other.

Based on the above operation, the ON resistance $r_{mos}$ of the transistors 311 to 315 (the transistor 131P shown in FIG. 7) included in the pull-up circuit 131 should ideally become $r_{mos}$=Re−R1. Therefore, when the resistance of the external resistor Re is 240Ω and when the resistance of the resistor R1 is 120Ω, the on resistance $r_{mos}$ should become 120Ω.

However, as explained with reference to FIG. 7, the power source resistance $r_p$ is present between the power source terminal VDDQ and the pull-up circuit 131. Therefore, the actual ON resistance $r_{mos}$ of the transistor 131P after the calibration operation becomes $r_{mos}$=Re−R1−$r_p$. Therefore, when the external resistor Re has 240Ω, when the resistor R1 has 120Ω, and when the power source resistance $r_p$ has 1.4Ω, the on resistance $r_{mos}$ becomes 118.6Ω. In other words, the impedance of the pull-up circuit 131 (=$r_{mos}$+R1) is adjusted to 238.6Ω (=Re−$r_p$), instead of the target value 240Ω.

When the level of the impedance control signal DRZQP is defined in this way, the control signal ACT2 is activated next (step S14). As a result, the count operation of the counter 135 included in the calibration circuit 130 is started.

Consequently, the impedance of the pull-down circuit 133 is brought close to the impedance of the pull-up circuit 132. Thereafter, the control signal ACT2 is inactivated, and the count operation of the counter 135 is stopped (step S14). As a result, the count value of the counter 135 is fixed, and the levels of the impedance control signals DRZQN1 to DRZQN5 (=DRZQN) are defined.

Based on this operation, the impedance (=$r_{mos}$+R1) of the pull-down circuit 133 approximately coincides with the impedance (Re−$r_p$) of the pull-up circuit 132. Therefore, as described in the above example, when the impedance of the pull-up circuit 132 is 238.6Ω instead of 240Ω as the target value, the impedance of the pull-down circuit 133 is also adjusted to 238.6Ω, instead of 240Ω as the target value.

Referring back to step S11, the instruction of the calibration operation based on the external command is awaited. When the calibration operation is instructed (step S11: YES), the above series of operation are carried out again.

The above explains the calibration operation. The impedance control signal DRZQ defined by the above calibration operation is supplied in common to the pre-stage circuits 141 to 14n shown in FIG. 1. Therefore, the on resistance $r_{mos}$ of the transistor parallel circuit included in the unit buffers 111 to 11n coincides with the on resistance $r_{mos}$ of the transistor parallel circuit included in the pull-up circuits 131 and 132 or the pull-down circuit 133.

The data output operation is explained next.

The data output operation needs to be executed after the above calibration operation is carried out by at least one time. Accordingly, the data output operation can be carried out in the accurate impedance.

The output circuit 100 according to the present embodiment uses i (where i denotes an integer of 1 to n) unit buffers 111 to 11i in parallel. A unit buffer having a higher resistance should be selected with priority. As a result, the output impedance can be set to X/i when the impedance of the unit buffer 111 including the power source resistance $r_p$ is X, 240Ω for example.

Specifically, when the required output impedance is 240Ω (i=1), only the unit buffer 111 should be operated. The impedance of the unit buffer 111 is the same as the impedance (Re−$r_{mos}$=238.6Ω) of the replica buffer included in the calibration circuit 130. Therefore, the output impedance including the resistance of the power source resistance $r_p$ accurately becomes 240Ω.

To set the output impedance to 120Ω (i=2), the unit buffers 111 and 112 should be operated simultaneously. As described above, the resistance of the resistor R2 included in the unit buffer 112 is lower than that of the resistor R1 included in the unit buffer 111, and is preferably R2≈R1−2$r_p$. Therefore, when the resistance of the power source resistance $r_p$ is 1.4Ω, the impedance of the unit buffer 112 becomes 235.8Ω. In this case, the output impedance including the resistance of the power source resistance $r_p$ becomes approximately 120Ω, and approximately coincides with the value of the target value X/2.

On the other hand, when the configurations of the unit buffer 111 and the unit buffer 112 are exactly the same, like in the conventional output circuit, the output impedance including the resistance of the power source resistance $r_p$ becomes 120.7Ω, and is slightly deviated from the target value X/2. In order to correct this error, the resistance of the resistor R2 is set lower than that of R1 in the present embodiment.

Further, to set the output impedance to 80Ω (i=3), the unit buffers 111 to 113 should be operated simultaneously. The resistance of the resistor R3 included in the unit buffer 113 is set lower than the resistance of the resistor R2 included in the unit buffer 112, and, preferably, R3≈R2−2$r_p$. Therefore, when the resistance of the power source resistance $r_p$ is 1.4Ω, the impedance of the unit buffer 113 becomes 233.0Ω. In this case, the output impedance including the resistance of the power source resistance $r_p$ becomes approximately 80Ω, and approximately coincides with the target value X/3.

In this case, when the configurations of the unit buffers 111 to 113 are exactly the same, like in the conventional output circuit, the output impedance including the resistance of the power source resistance $r_p$ becomes 80.9Ω, and is slightly deviated from the target value X/3. Such an error becomes larger when the number (=i) of unit buffers used in parallel becomes larger. When i=7, the error rate reaches 4.4%.

Similarly, in setting the output impedance to X/i, when the i unit buffers 111 to 11i are used in parallel, the output impedance including the resistance of the power source resistance $r_p$ can be approximately coincided with the target value X/i.

In order to actually operate the unit buffers 111 to 11n, the selection signals 151P, 151N to 15nP, and 15nN that are output from the output control circuit 150 are set to predetermined logic levels.

Specifically, in order to output the high level signal from the output terminal DQ, the selection signals 151P, 151N to 15nP, and 15nN corresponding to the unit buffers 111 to 11n to be operated are set to the low level. Accordingly, the pull-up circuit PU included in the unit buffers is turned on, and the high-level signals are output from the output terminal DQ. On the other hand, in order to output the low level signal from the output terminal DQ, the selection signals 151P, 151N to 15nP, and 15nN corresponding to the unit buffers 111 to 11n to be operated are set to the high level. Accordingly, the pull-down circuit PD included in the unit buffers is turned on, and the low-level signals are output from the output terminal DQ.

Regarding the unit buffers 111 to 11n that are not operated at the data output operation, the corresponding selection signals 151P to 15nP are set to the high level, and the corresponding selection signals 151N to 15nN are set to the low level. Accordingly, the pull-up circuit PU and the pull-down circuit PD included in the unit buffers are turned off, and the unit buffer is set to the high-impedance state.

When the ODT (On Die Termination) function using the output terminal 100 as the end terminal is used, the selection signals 151P to 15nP corresponding to the unit buffers 111 to 11n to be operated are set to the low level, and the selection signals 151N to 15nN are set to the high level, corresponding to the requested ODT impedance. Accordingly, the pull-up circuit PU and the pull-down circuit PD included in the unit buffers are turned on, and the output circuit 100 functions as the terminal resistor.

As explained above, the output circuit 100 according to the present embodiment has differentiated resistance values of the resistors R1 to Rn included in the unit buffers 111 to 11n, by taking the power source resistance $r_p$ into account. Therefore, the output impedance including the resistance of the power source resistance $r_p$ can be approximately coincided with the target value (X/i).

In the output circuit 100 according to the present embodiment, the resistance values of all the resistors R1 to Rn included in the unit buffers 111 to 11n are differentiated, thereby obtaining a more accurate output impedance. Depending on the required precision of the output impedance, resistance values of a part of the resistors R1 to Rn included in the unit buffers 111 to 11n can be coincided with each other. An example in which the resistance values of a part of the resistors included in the unit buffers are coincided with each other is explained below.

Figure 12:
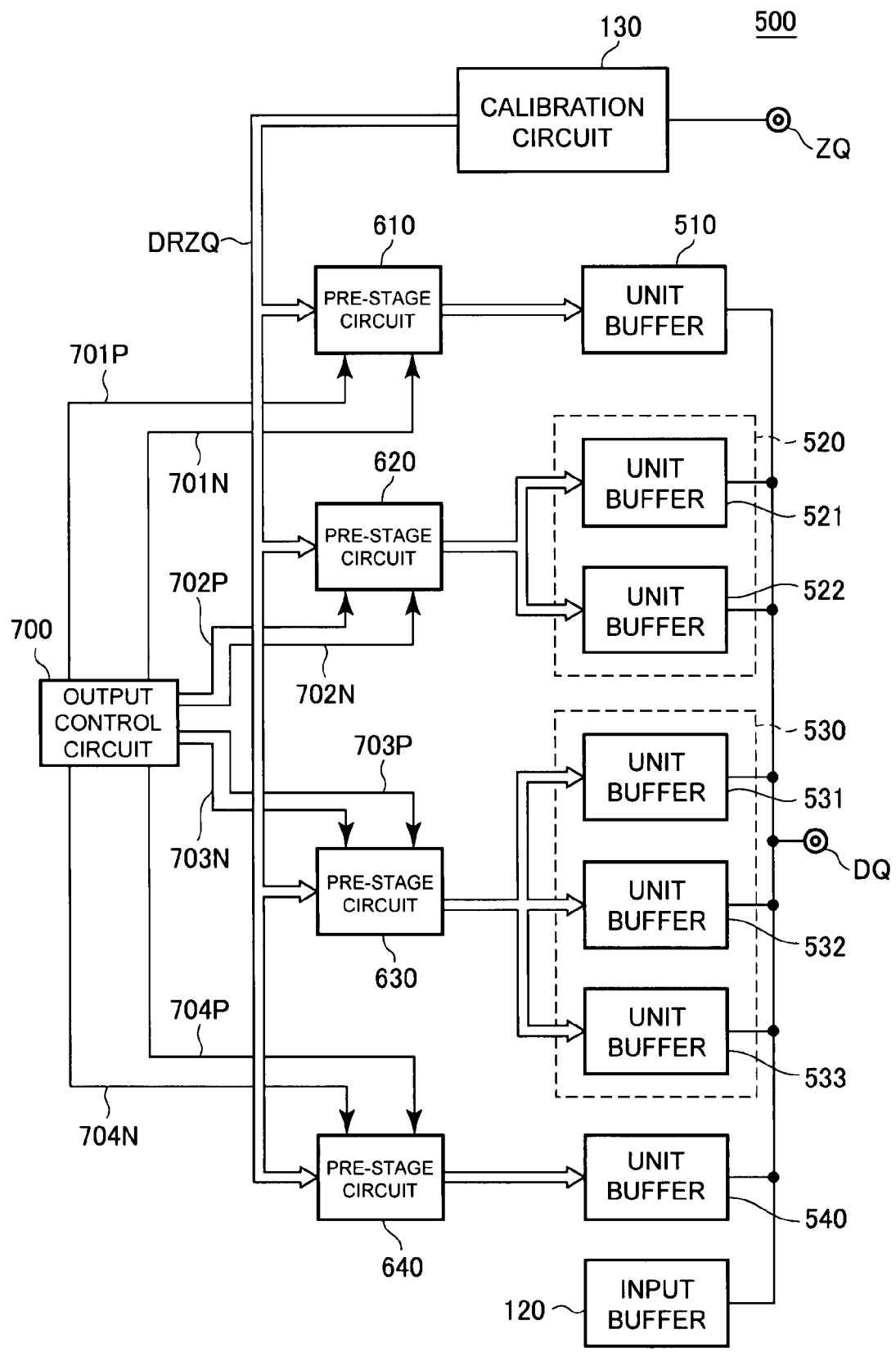
FIG. 12 is a block diagram showing a configuration of an output circuit (an input and output circuit) of a semiconductor device according to a second preferred embodiment of the present invention.

FIG. 12 is a block diagram showing a configuration of an output circuit (an input and output circuit) 500 of a semiconductor device according to a second preferred embodiment of the present invention. In FIG. 12, constituent elements of the output circuit 500 having the same configurations as those of the output circuit 100 shown in FIG. 1 are denoted with like reference numerals, and their redundant explanations will be omitted.

As shown in FIG. 12, the output circuit 500 according to the present embodiment includes seven unit buffers 510, 521, 522, 531 to 533, and 540 that are connected to the output terminal DQ. The configurations of these unit buffers are as shown in FIG. 2, except that the input signals and the inserted resistors are different.

Out of the above unit buffers, the two unit buffers 521 and 522 constitute an output buffer 520, and the three unit buffers 531 to 533 constitute an output buffer 530. Although the unit buffers 510 and 540 are not grouped, the unit buffers 510 and 540 are also called output buffers 510 and 540 in some cases.

In the present embodiment, pre-stage circuits 610, 620, 630, and 640 are provided corresponding to the output buffers 510, 520, 530, and 540, respectively. Therefore, one pre-stage circuit 620 controls in common the two unit buffers 521 and 522 included in the output buffer 520. One pre-stage circuit 630 controls in common the three unit buffers 531 to 533 included in the output buffer 530. The pre-stage circuits 610, 620, 630, and 640 have the same circuit configurations as that of the pre-stage circuit 141 shown in FIG. 8, except that an output control circuit 700 supplies selection signals 701P, 701N to 704P, and 704N, instead of the selection signals 151P and 151N.

Figure 13:
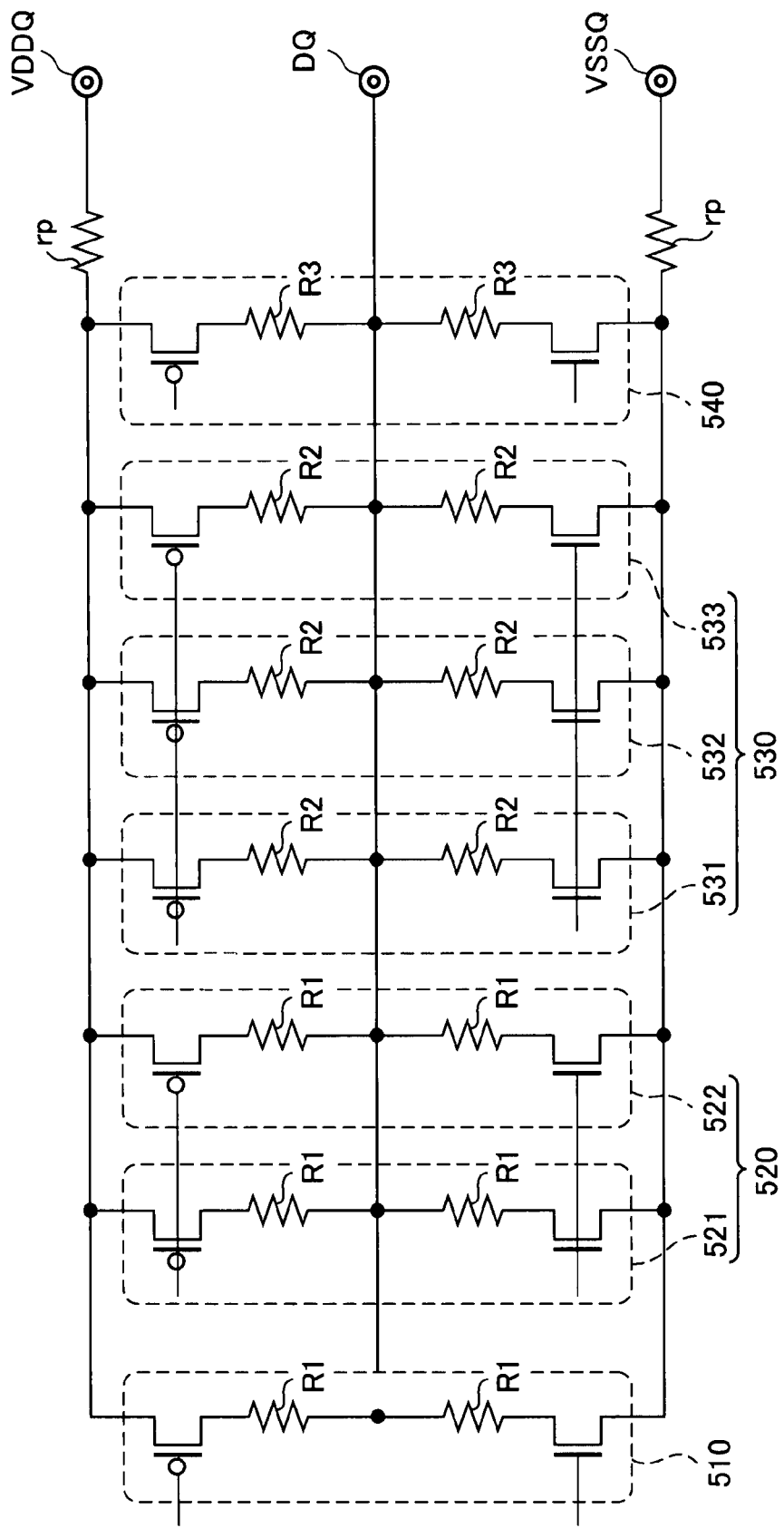
FIG. 13 is an equivalent circuit diagram of the output buffers shown in FIG. 12.

FIG. 13 is an equivalent circuit diagram of the output buffers 510, 520, 530, and 540. FIG. 13 equivalently expresses parallel transistors included in the unit buffers as one transistor, similarly to FIG. 3.

As shown in FIG. 13, in the present embodiment, each of the unit buffers 510, 521, and 522 is provided with the resistor R1. The unit buffers 531 to 533 are provided with the resistor R2. The unit buffer 540 is provided with the resistor R3. When the resistance of the power source resistance $r_p$ is 1.4Ω, the resistance values of the resistors R1 to R3 are set as follows: R1=120Ω; R2=110Ω; and R3=100Ω. The resistor R1 provided in the unit buffers 510, 521, and 522, respectively has the same resistance value as that of the resistor R1 provided in the replica buffer within the calibration circuit 130.

FIG. 14 is a table showing a relationship between a target output impedance and an output buffer to be operated. FIG. 14 also shows the output impedance actually obtained, and the conventional output impedance when the resistors included in all unit buffers are set to the resistance of the resistor R1 (=120Ω).

The output circuit 500 according to the present embodiment has seven unit buffers, and therefore, can be set to any one of the seven kinds of output impedances. In other word, the output circuit 500 can be set to any one of the seven kinds of output impedances including 240Ω, 120Ω, 80Ω, 60Ω, 48Ω, 40Ω, and 34Ω.

Specifically, in setting the output impedance to 240Ω, only the output buffer 510 is activated as shown in FIG. 14. As described above, the resistor R1 included in the output buffer (the unit buffer) 510 has the same resistance value as that of the resistor R1 set in the replica buffer. Therefore, the output impedance actually obtained also becomes 240Ω.

In setting the output impedance to 120Ω, only the output buffer 520 is activated. Accordingly, the output impedance actually obtained becomes 120.7Ω. Although this output impedance is slightly deviated from the target output impedance, the error is only small.

In setting the output impedance to 80Ω, both the output buffers 510 and 520 are activated simultaneously. Accordingly, the output impedance actually obtained becomes 80.9Ω. Although the deviation of this output impedance from the target output impedance increases, the error is still within about 1%.

In setting the output impedance to 60Ω, both the output buffers 510 and 530 are activated simultaneously. Accordingly, the output impedance actually obtained becomes 59.2Ω. As shown in FIG. 14, when the resistor included in all the unit buffers is R1, the output impedance actually obtained is 61.1Ω, and the error is smaller in the present embodiment.

In setting the output impedance to 48Ω, both the output buffers 520 and 530 are activated simultaneously. Accordingly, the output impedance actually obtained becomes 47.9Ω. When the resistor included in all the unit buffers is R1, the output impedance actually obtained is 49.1Ω, and the error is smaller in the present embodiment.

In setting the output impedance to 40Ω, the output buffers 510 to 530 are activated simultaneously. Accordingly, the output impedance actually obtained becomes 40.3Ω. When the resistor included in all the unit buffers is R1, the output impedance actually obtained is 41.2Ω, and the error is smaller in the present embodiment.

In setting the output impedance to 34Ω, all the output buffers 510 to 540 are activated simultaneously. Accordingly, the output impedance actually obtained becomes 34.4Ω. When the resistor included in all the unit buffers is R1, the output impedance actually obtained is 35.5Ω, and the error is smaller in the present embodiment.

As explained above, in the present embodiment, resistance values of a part of resistors included in the unit buffers 510,

521, 522, 531 to 533, and 540 are coincided. Therefore, although the correction precision of the power source resistance $r_p$ slightly decreases, the number of the pre-stage circuits 610 to 640 can be substantially decreased. Accordingly, while preventing the increase in the circuit scale, the deviation of the output impedance attributable to the power source resistance $r_p$ can be corrected. Consequently, the output circuit 500 according to the present embodiment can exhibit a large effect in the actual semiconductor device of which circuit scale is required to be decreased.

The semiconductor device according to the present invention can be a semiconductor memory device such as a DRAM, for example. A plurality of DRAMs can be mounted on the memory module. However, the semiconductor device is not limited to DRAM mounted on the memory module. The external resistor Re can be a discrete device disposed on the memory module, and the like. Further, one external resistor Re can be allocated to one semiconductor memory device, and also one external resistor Re can be shared by plural semiconductor memory devices on the memory module.

The semiconductor device according to the present invention is also directly mounted on the data processing system. However, the configuration of the semiconductor device is not limited to this. A device constituting the external resistor Re can be mounted on the system substrate, and can be also mounted on the package of the semiconductor device. A resistance value of the external resistor Re can be optionally determined by the data processing system.

Figure 15:
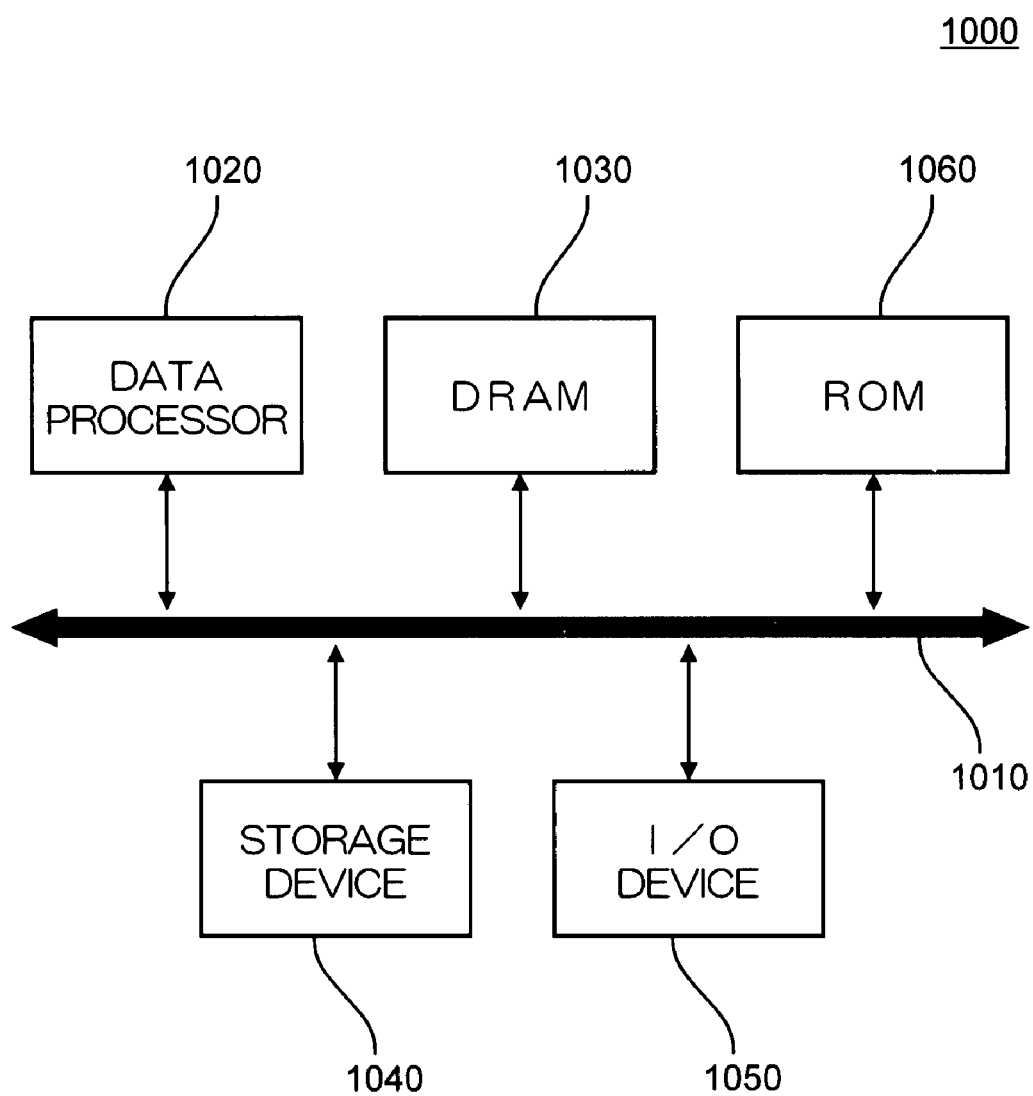
FIG. 15 is a block diagram showing a configuration of a data processing system according to a preferred embodiment of the present invention.

FIG. 15 is a block diagram showing a configuration of a data processing system 1000 using a semiconductor memory device according to a preferred embodiment of the present invention. The semiconductor memory device according to the present embodiment is a DRAM.

The data processing system 1000 shown in FIG. 15 includes a data processor 1020 and a semiconductor memory device (DRAM) 1030 according to the present embodiment connected to each other via a system bus 1010. The data processor 1020 includes a microprocessor (MPU) and a digital signal processor (DSP), for example. However, the constituent elements of the data processor 1020 are not limited to these. In FIG. 15, while the data processor 1020 and the DRAM 1030 are connected to each other via the system bus 1010, to simplify the explanation, the data processor 1020 and the DRAM 1030 can be connected to each other via a local bus without via the system bus 1010.

While only one set of the system bus 1010 is drawn to simplify the explanation in FIG. 15, the system bus can be set in series or in parallel via the connector according to need. In the memory system data processing system shown in FIG. 15, a storage device 1040, an I/O device 1050, and a ROM 1060 are connected to the system bus 1010. However, these are not necessarily essential constituent elements of the invention.

The storage device 1040 includes a hard disk drive, an optical disk drive, and a flash memory. The I/O device 1050 includes a display device such as a liquid-crystal display, and an input device such as a keyboard and a mouse. The I/O device 1050 may be any one of the input device and the output device. Further, while each one constituent element is drawn in FIG. 15 to simplify the explanation, the number of each constituent element is not limited to one, and may be one or two or more.

The present invention is in no way limited to the aforementioned embodiments, but rather various modifications are possible within the scope of the invention as recited in the claims, and naturally these modifications are included within the scope of the invention.

Figure 16:
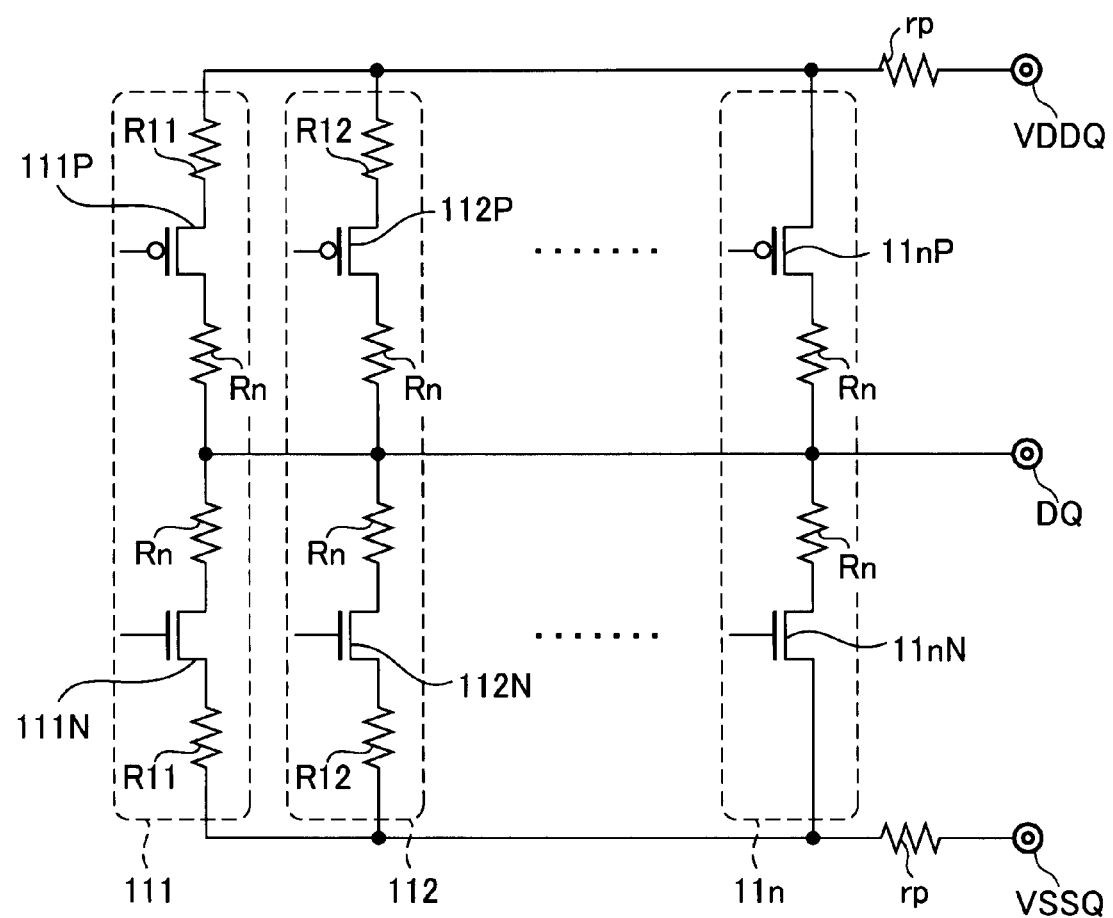
FIG. 16 is a modified equivalent circuit diagram of the unit buffers.

For example, in the first embodiment, as shown in FIG. 3, the resistors R1 to Rn are inserted into between the transistors 111P to 11nP at the pull-up side and the output terminal DQ and into between the transistors 111N to 11nN at the pull-down side and the output terminal DQ, and the resistance values of the resistors R1 to Rn are differentiated from one another. However, the present invention is not limited to this. As shown in FIG. 16, the resistors between these transistors and the output terminal DQ can be consistently set to Rn, and separate resistors R11, R12, . . . can be set between the transistors and the power source terminal VDDQ and the power source terminal VSSQ.

In this case, when the relationships of Rn+R11=R1, Rn+R12=R2, . . . are satisfied by setting the resistance values of the resistors R11, R12, . . . as R11>R12>, . . . , the same effect as that of the first embodiment can be obtained. According to this method, the resistors between the transistors and the output terminal DQ can be consistently set to Rn, thereby facilitating the circuit design.

In the second embodiment, each of the two unit buffers 521 and 522 that constitute the output buffer 520 has an independent circuit. Similarly, each of the three unit buffers 531 to 533 that constitute the output buffer 530 also has an independent circuit. However, these circuits do not need to be completely independent of each other. So long as individual unit buffers can be regarded as the same as a replica buffer, these unit buffers can be mutually connected within the output buffer, as shown in FIG. 17.

Figure 17:
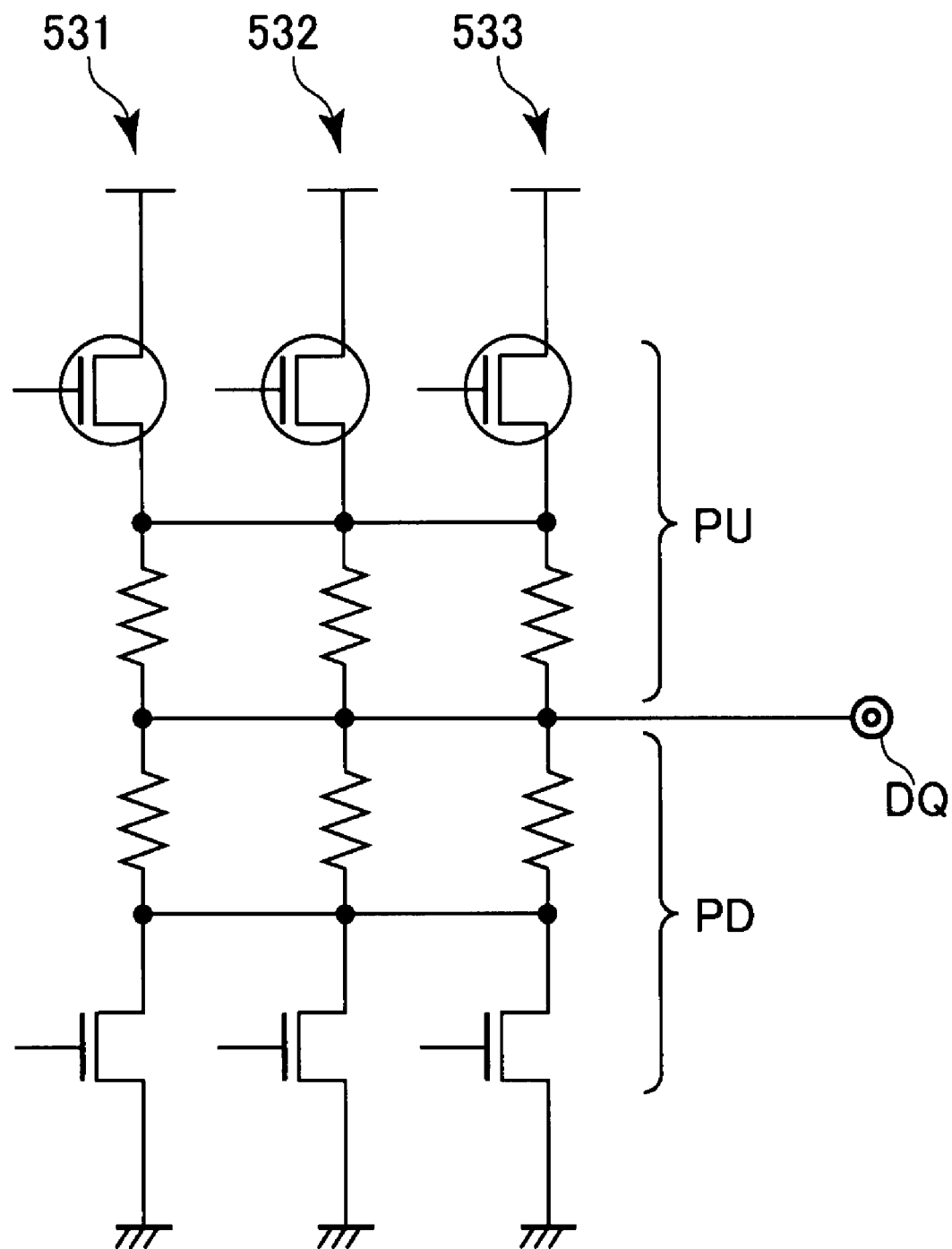
FIG. 17 is a circuit diagram showing an example of a mutual connection of the unit buffers inside the circuit.

FIG. 17 shows the three unit buffers 531 to 533 that constitute the output buffer 530, and that are connected to each other inside the output buffer 530. In this example, the contacts of the P-channel MOS transistor that is included in the pull-up circuit PU and the resistor are connected to each other. Similarly, the contacts of the N-channel MOS transistor that is included in the pull-down circuit PD and the resistor are connected to each other. In this case, the individual unit buffers 531 to 533 are regarded as the same as a replica buffer. Therefore, in the present invention, the "parallel connection of unit buffers" also includes this case.

What is claimed is:

1. An output circuit of a semiconductor device comprising:
   a first output buffer including one unit buffer having a series circuit of a transistor and a resistor;
   a second output buffer having m unit buffers connected in parallel, each unit buffer having a series circuit of a transistor and a resistor; and
   a third output buffer having n unit buffers connected in parallel, each unit buffer having a series circuit of a transistor and a resistor, wherein
   ON resistance values of the transistors included in the first to the third output buffers are mutually substantially the same,
   resistance values of the resistors included in the second output buffer are mutually substantially the same,
   resistance values of the resistors included in the third output buffer are mutually substantially the same, and
   resistance values of at least the two resistors included in the first to the third output buffers are different from each other.

2. The output circuit of a semiconductor device as claimed in claim 1, wherein the resistance values of the resistor included in the first output buffer are different from the resistance values of the resistors included in the third output buffer.

3. The output circuit of a semiconductor device as claimed in claim 2, wherein the resistance values of the resistors included in the third output buffer are lower than at least one of the resistance values of the resistors included in the first and the second output buffers.

4. The output circuit of a semiconductor device as claimed in claim 1, wherein the resistance values of the resistors included in the second output buffer are different from the resistance values of the resistors included in the third output buffer.

5. The output circuit of a semiconductor device as claimed in claim 1, wherein the resistance values of the resistor included in the first output buffer are substantially the same as the resistance values of the resistors included in the second output buffer.

6. The output circuit of a semiconductor device as claimed in claim 1, wherein m is equal to 2 and n is equal to 3,
- when one unit buffer is used, the first output buffer is selected,
- when two unit buffers are used, the second output buffer is selected,
- when three unit buffers are used, the first and the second output buffers are selected simultaneously,
- when four unit buffers are used, the first and the third output buffers are selected simultaneously,
- when five unit buffers are used, the second and the third output buffers are selected simultaneously, and
- when six unit buffers are used, the first to the third output buffers are selected simultaneously.

7. The output circuit of a semiconductor device as claimed in claim 1, further comprising a fourth output buffer including one unit buffer having a series circuit of a transistor and a resistor, wherein
- ON resistance values of the transistors included in the first to the fourth output buffers are mutually substantially the same, and
- resistance values of the resistor included in the fourth output buffer are different from resistance values of the resistors included in the first to the third output buffers.

8. The output circuit of a semiconductor device as claimed in claim 7, wherein resistance values of the resistors included in the fourth output buffer are lower than resistance values of the resistors included in the first to the third output buffers.

9. The output circuit of a semiconductor device as claimed in claim 7, wherein when seven unit buffers are selected, the first to the fourth output buffers are selected simultaneously.

10. The output circuit of claim 1, further comprising:
- a first pre-stage circuit connected to the first output buffer;
- a second pre-stage circuit connected to the second output buffer; and
- a third pre-stage circuit connected to the third output buffer.

* * * * *